(12) United States Patent
Chia et al.

(10) Patent No.: US 9,949,408 B2
(45) Date of Patent: Apr. 17, 2018

(54) BLANK CARD WITH SCALABLE AIRFLOW IMPEDANCE FOR ELECTRONIC ENCLOSURES

(71) Applicant: Cisco Technology, Inc., San Jose, CA (US)

(72) Inventors: Vic Chia, Sunnyvale, CA (US); M. Baris Dogruoz, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/166,551

(22) Filed: May 27, 2016

(65) Prior Publication Data
US 2017/0347495 A1    Nov. 30, 2017

(51) Int. Cl.
*H05K 7/20* (2006.01)
*H05K 9/00* (2006.01)

(52) U.S. Cl.
CPC ......... *H05K 7/20736* (2013.01); *H05K 9/002* (2013.01)

(58) Field of Classification Search
CPC .......... H05K 7/20736; H05K 7/20145; H05K 7/20554–7/20572; H05K 7/20718–7/20727
USPC ....... 361/679.49–679.51, 695, 727, 816, 818
See application file for complete search history.

(56) References Cited

U.S. PATENT DOCUMENTS

| | | | | |
|---|---|---|---|---|
| 4,729,292 A * | 3/1988 | Marton | ................. | F24F 13/075 454/284 |
| 5,322,533 A * | 6/1994 | Todorovic | .......... | B01D 46/0043 454/58 |
| 6,285,548 B1 * | 9/2001 | Hamlet | ................ | H05K 9/0062 174/15.1 |
| 7,733,646 B2 * | 6/2010 | Hisatsune | .......... | H05K 7/20172 174/383 |
| 7,864,541 B2 * | 1/2011 | Lucero | ...................... | G06F 1/20 361/679.51 |
| 7,983,038 B2 * | 7/2011 | Levesque | ........... | H05K 7/20572 211/26 |
| 8,459,756 B2 | 6/2013 | Linhares, Jr. et al. | | |
| 8,764,405 B2 * | 7/2014 | Mashak | ................ | F04D 27/001 361/679.5 |
| 9,345,172 B2 * | 5/2016 | Larsen | ............... | H05K 7/20709 |
| 9,699,937 B2 * | 7/2017 | Merlet | ............... | H05K 7/20563 |

(Continued)

OTHER PUBLICATIONS

"MicroTCA Enhancements for Rear I/O and Precision Timing", PICMG Specification MTCA.4, Revision 1.0, 100 pages, Aug. 2011, PCI Industrial Computer Manufacturers Group.

*Primary Examiner* — Dion R Ferguson
*Assistant Examiner* — Amir Jalali
(74) *Attorney, Agent, or Firm* — Parker Ibrahim & Berg LLP; James M. Behmke; Stephen D. LeBarron (57) ABSTRACT

In one embodiment, an electromagnetic interference (EMI) shielding faceplate is configured to mount to a line-card slot of a multi-line-card electronic enclosure having an airflow cooling system. A perforation pattern in the faceplate defines an array of perforations in the faceplate, while a flow control sheet affixed to the faceplate and covering an adjustable percentage of the array of perforations in the faceplate from 0-100%, where an amount of airflow impedance caused by the perforations for the airflow cooling system is based on the percentage of the array of perforations covered by the flow control sheet.

19 Claims, 12 Drawing Sheets

(56) References Cited

U.S. PATENT DOCUMENTS

| | | | |
|---|---|---|---|
| 2003/0221437 A1* | 12/2003 | Kuo | F24F 1/0011 62/262 |
| 2004/0227435 A1* | 11/2004 | Rasmussen | H05K 7/20572 312/236 |
| 2005/0075066 A1* | 4/2005 | Palmer | F24F 5/0035 454/201 |
| 2005/0168942 A1* | 8/2005 | Steinbrecher | H05K 7/20209 361/690 |
| 2005/0168945 A1 | 8/2005 | Coglitore | |
| 2005/0241810 A1* | 11/2005 | Malone | H05K 7/20727 165/122 |
| 2007/0093197 A1* | 4/2007 | Shah | F24F 13/082 454/365 |
| 2009/0097203 A1* | 4/2009 | Byers | H05K 7/20618 361/695 |
| 2010/0118489 A1* | 5/2010 | Izuhara | H05K 9/0062 361/694 |
| 2012/0285665 A1* | 11/2012 | Rebeyrotte | H05K 7/20563 165/104.34 |
| 2013/0128450 A1* | 5/2013 | Redshaw | F24F 11/0078 361/679.46 |
| 2015/0208554 A1* | 7/2015 | Leigh | G06F 1/20 165/80.3 |
| 2016/0081220 A1* | 3/2016 | Chia | F24F 7/007 361/692 |
| 2016/0128230 A1* | 5/2016 | Lam | H05K 9/0062 361/695 |
| 2016/0135334 A1* | 5/2016 | Rodriguez | H05K 7/20836 165/276 |

* cited by examiner

BLANK CARD WITH SCALABLE AIRFLOW IMPEDANCE FOR ELECTRONIC ENCLOSURES

TECHNICAL FIELD

The present disclosure relates generally to electronic enclosures (e.g., line-card chassis), and, more particularly, to a blank card with scalable airflow impedance for electronic enclosures.

BACKGROUND

Blank cards are widely used for electromagnetic interference (EMI) containment and airflow distribution purposes in any electronic enclosures, such as enterprise switches or computing servers. However the perforation on the blank cards is typically designed to have small openings for better EMI shielding and higher airflow impedance to prevent airflow bypass.

Theoretically, the concept of high impedance blanks makes sense because it would force more airflow distribution to the functional cards within a system, hence a better cooling scheme. However, with high impedance blanks in the system, this also translates to high system resistance, hence a lower overall system airflow. The result is actually a hotter line-card or blade due to the reduction of total system airflow.

To make matters worse, there are various line-cards that can go into a same system enclosure, where each of the line-cards has a very different airflow impedance (e.g., due to the density of front end I/O connectors, perforations, general design, etc.), thus, a single impedance blank design would soon be a problem when high-power and high-impedance card are inserted in the system. The combination of high-impedance blanks and functional cards would further lower the system airflow throughput, thus causing over-heating of the line-card(s).

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

According to one or more embodiments of the disclosure, an electromagnetic interference (EMI) shielding faceplate is configured to mount to a line-card slot of a multi-line-card electronic enclosure having an airflow cooling system. A perforation pattern in the faceplate defines an array of perforations in the faceplate, while a flow control sheet affixed to the faceplate and covering an adjustable percentage of the array of perforations in the faceplate from 0-100%, where an amount of airflow impedance caused by the perforations for the airflow cooling system is based on the percentage of the array of perforations covered by the flow control sheet.

According to one or more additional embodiments of the disclosure, an EMI shielding faceplate is mounted to a line-card slot of a multi-line-card electronic enclosure having an airflow cooling system, the faceplate having a perforation pattern defining an array of perforations in the faceplate. After determining a desired airflow impedance for the airflow cooling system, an affixed flow control sheet on the faceplate may then be adjusted based on the desired airflow impedance, the flow control sheet covering an adjustable percentage of the array of perforations in the faceplate from 0-100%, where the adjusting affects an amount of airflow impedance caused by the perforations for the airflow cooling system based on the percentage of the array of perforations covered by the flow control sheet after the adjusting.

According to one or more additional embodiments of the disclosure, a system comprises a multi-line-card electronic enclosure, an airflow cooling system for the multi-line-card electronic enclosure, one or more functional line-cards located in a corresponding line-card slot of the multi-line-card electronic enclosure, and one or more EMI shielding faceplates mounted to a corresponding line-card slot of the multi-line-card electronic enclosure, the one or more faceplates each having a perforation pattern defining an array of perforations in the corresponding faceplate, and an affixed flow control sheet covering an adjustable percentage of the array of perforations in the corresponding faceplate from 0-100%, wherein an amount of airflow impedance caused by the perforations for the airflow cooling system is based on the percentage of the array of perforations covered by the flow control sheet for the one or more faceplates.

Description

As noted above, blank cards are widely used for electromagnetic interference (EMI) containment and airflow distribution purposes in any electronic enclosures, such as enterprise switches or computing servers.

Figure 1:
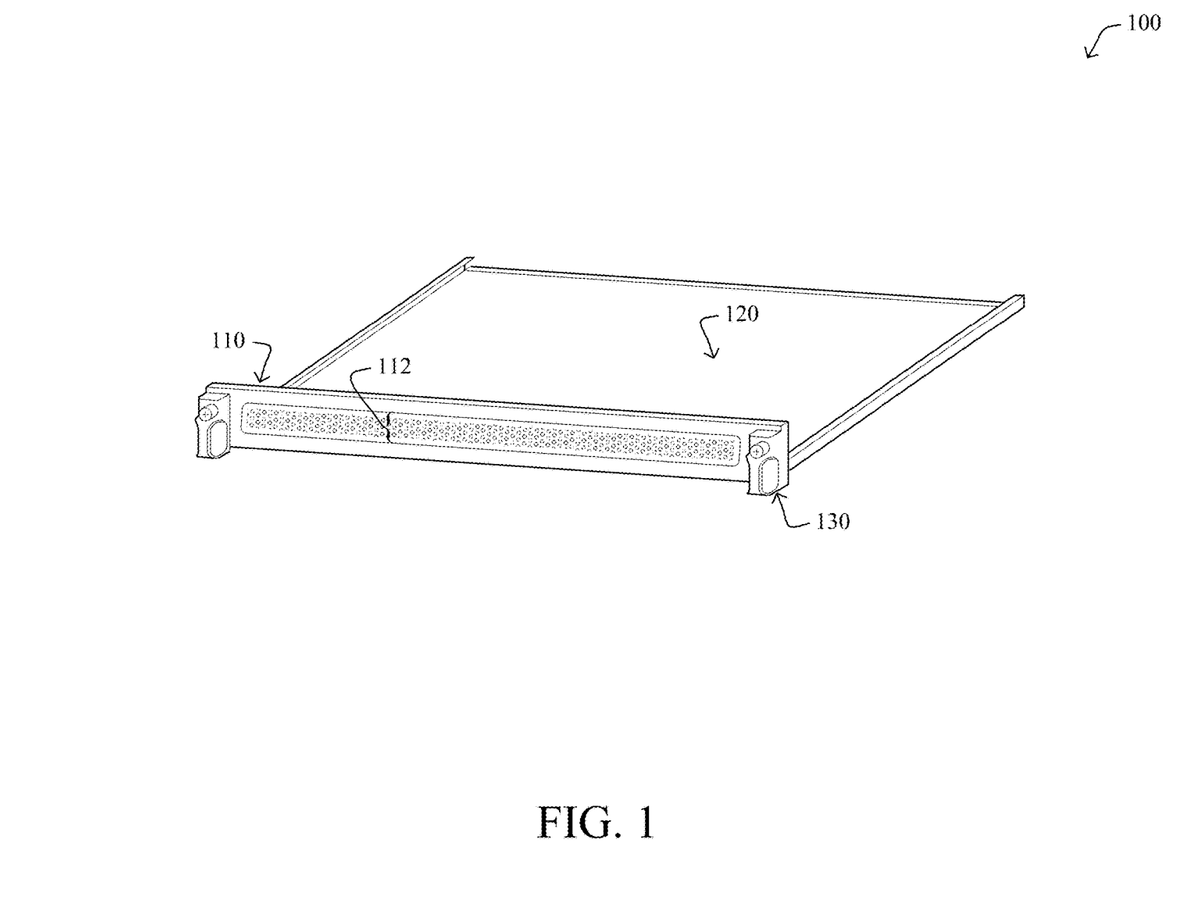
FIG. 1 illustrates an example blank card.

FIG. 1 illustrates an example of a blank card 100 having an electromagnetic interference (EMI) shielding faceplate 110 configured to mount to a line-card slot of a multi-line-card electronic enclosure having an airflow cooling system, as described below. Illustratively, the faceplate may be any suitable EMI shielding material, such as sheet metal, and a perforation pattern 112 on the faceplate defines an array of perforations in the faceplate for both airflow and EMI containment. Note that the blank card 100 may also have a blank line-card tray 120 configured to fit through a line-card slot of a multi-line-card electronic enclosure, as will be appreciated by those skilled in the art. Note also that various mounting/attachment mechanisms 130 such as tabs, screws, pins, etc., may also be present on the blank card 100.

Blank cards are widely used for two main purposes: to control electromagnetics emission, and to channel/balance airflow distribution to adjacent functional line-cards within a system. Previously, the perforation 112 on the blank card's faceplate 110 has been strategically restricted to higher impedance than that of a line card so that higher airflow could be obtained on functional line-cards to improve their cooling scheme. However, restricting the airflow via blank cards has created a system level challenge such that the total airflow of the system has also been reduced. For example, in an entry level system, only a few functional line-cards are used and the rest of the chassis is populated with blank cards. Previously, high impedance (restricted) blank cards have increased the overall system resistance, thus they relatively have affected the amount of airflow that could be drawn to functional line-cards, i.e., a by-pass between the blank and line cards.

Figure 2:
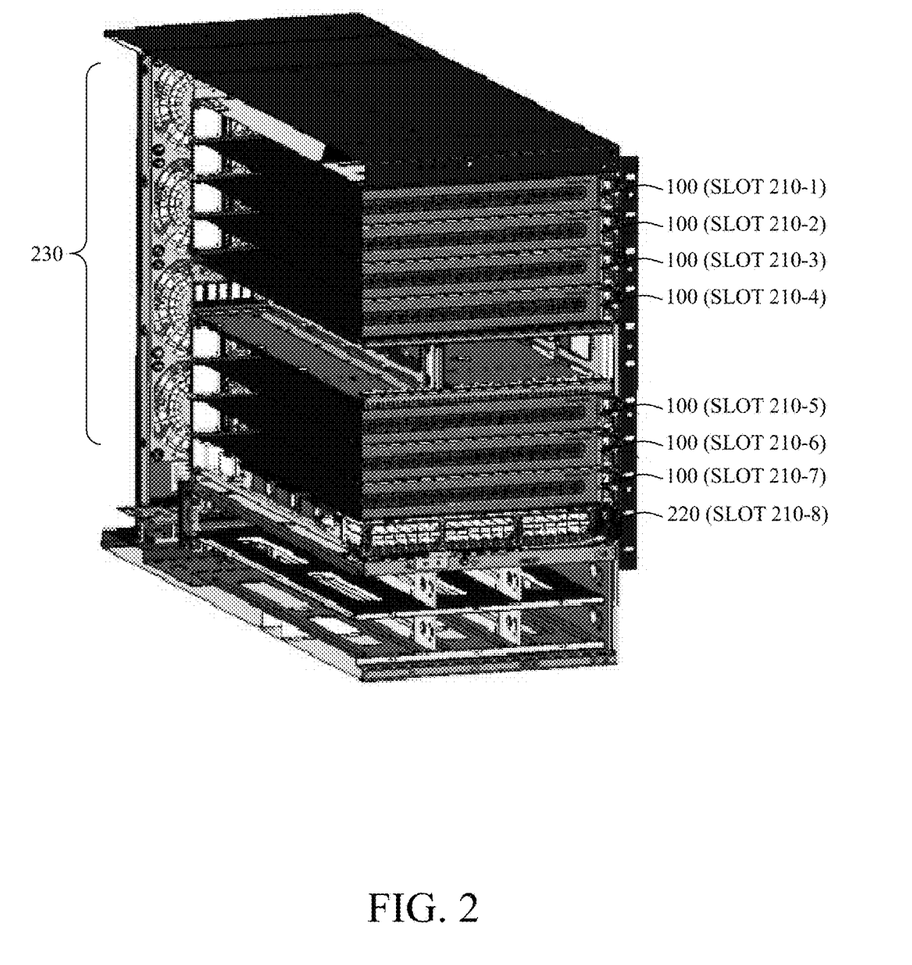
FIG. 2 illustrates an example electrical enclosure (e.g., computing chassis)

FIG. 2 illustrates an example of an electronic enclosure (e.g., chassis) 200, such as one built as a server, computer network device, computer storage device, etc. FIG. 2 illustrates a cut-away view from an accessible side of the enclosure (e.g., a field replaceable unit side or "front") where a plurality of line-card slots 210 may be populated with one or more functional line-cards 220 located in a corresponding line-card slot 210 of the multi-line-card electronic enclosure 200, or else one or more blank cards 100. As shown, slots 1-7 are filled with blank cards 100, while slot 8 is filled with a functional line-card 220. An airflow cooling system 230 for the multi-line-card electronic enclosure is shown on the "back" side of the enclosure, and may generally consist of a bank of one or more fans and associated control circuitry. In this arrangement, the cooling system (e.g., fans) 230 draws air from the front of the enclosure, through the line-card slots 210 and any associated line-cards 220 or blank cards 100. (Note that the techniques herein can be applied to both "Front-to-Back" architectures as shown as well as Side-to-Side architectures, as may be appreciated by those skilled in the art.)

Figure 3:
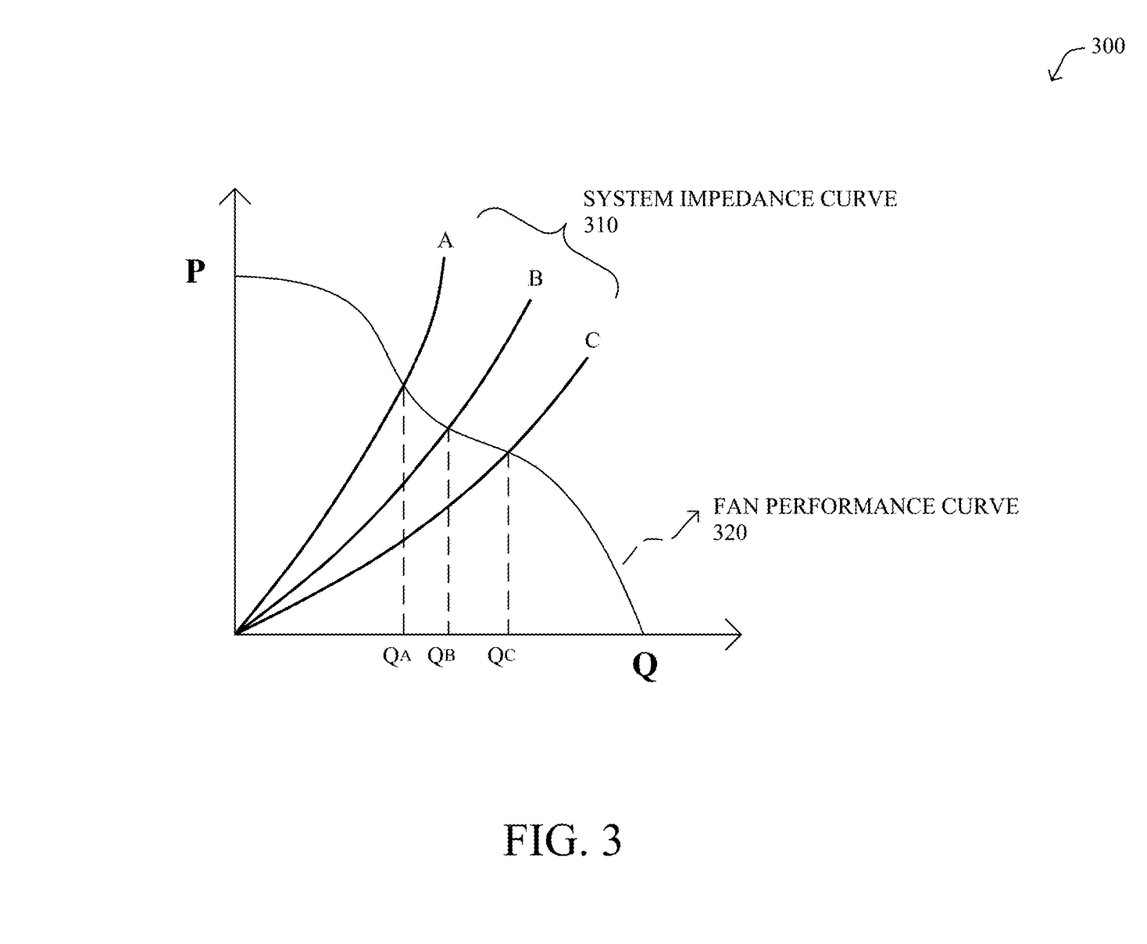
FIG. 3 illustrates an example graph of system impedance versus fan performance.
Figure 4A:
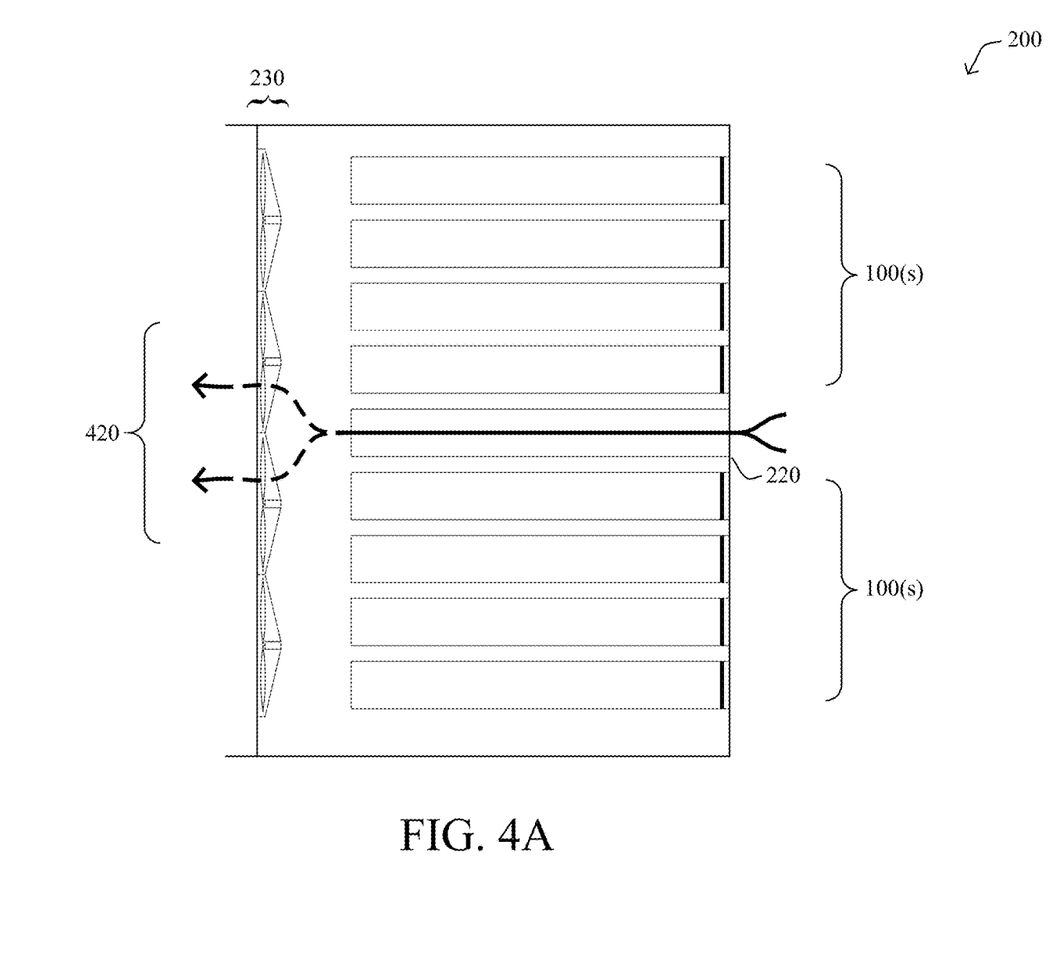
FIGS. 4A-4C illustrate examples of airflow through the electrical enclosure with different impedance arrangements.

With reference to the graph 300 of FIG. 3, a series of system impedance; curves 310 (A, B, and C) are shown in relation to a fan performance curve 320 on a system impedance (P) to airflow (Q) axis. Assume for reference that the impedance curve B corresponds to a fully loaded enclosure (i.e., full of functional line-cards, e.g., eight in the example enclosure 200). Theoretically, for the enclosure arrangement in FIG. 2, by restricting airflow on the high resistance blank cards, the ratio of the airflow rate on the functional line card 220 (slot 210-8) to the overall system airflow rate is higher. In other words, less by-pass is allowed on slot 8. This concept is shown in FIG. 4A, where airflow 420 is shown passing only through the functional line-card 220 (i.e., completely restricted airflow at the blank cards 100. to prove a point). Such an arrangement, however, also increases the overall system resistance, and therefore the impedance curve shifts from curve B to curve A, as shown in FIG. 3, which leads to less system volumetric flow obtained with curve A (single line-card with restrictive blank card fillers) compared to that of curve B (fully loaded with line-cards), i.e. $Q_A < Q_B$.

Hence, even though the by-pass is smaller on the line-card in slot 8, due to the reduction in the system volumetric flow rate, the flow rate on the slot 8 is also smaller. Said differently, most of the air flows through the line-card 220, but there is less air flowing through the cooling system 230. Consequently, the line-card in slot 8 runs hotter.

Figure 4B:
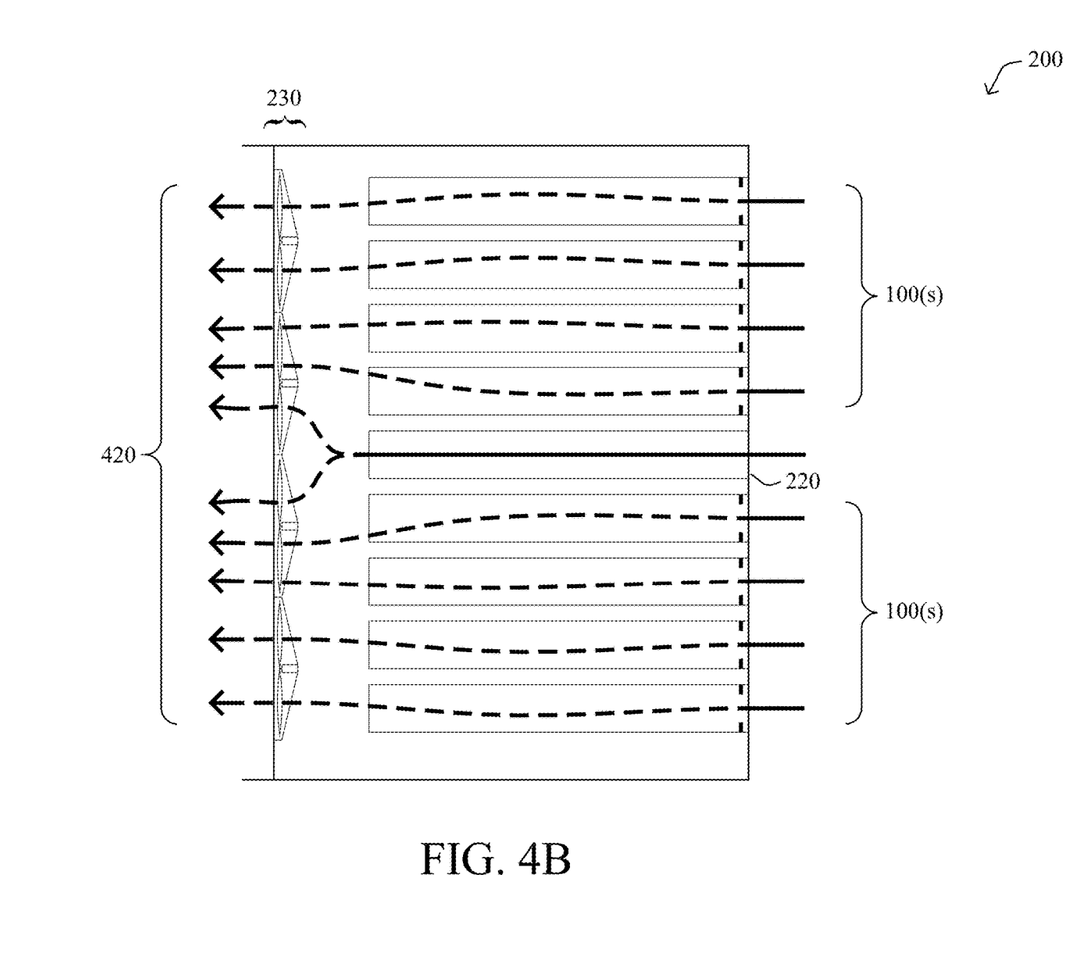

In contrast, if we allowed blank cards to be less impedant than functional line-cards, essentially we would increase the overall system volume flow rate, and the operating point would move from curve B to curve C in FIG. 3 (a single line-card with less-restricted blank cards), i.e., $Q_B < Q_C$, consequently the flow rate on the line-card would also increase, and better cooling would be obtained. That is, though the line-card has less of the proportion of the total airflow, since the total volume of the airflow is increased, this results in more air passing through the line-card. This concept is shown in FIG. 4B, where airflow 420 is shown passing through the functional line-card 220 and the less-restricted blank cards 100.

Figure 4C:
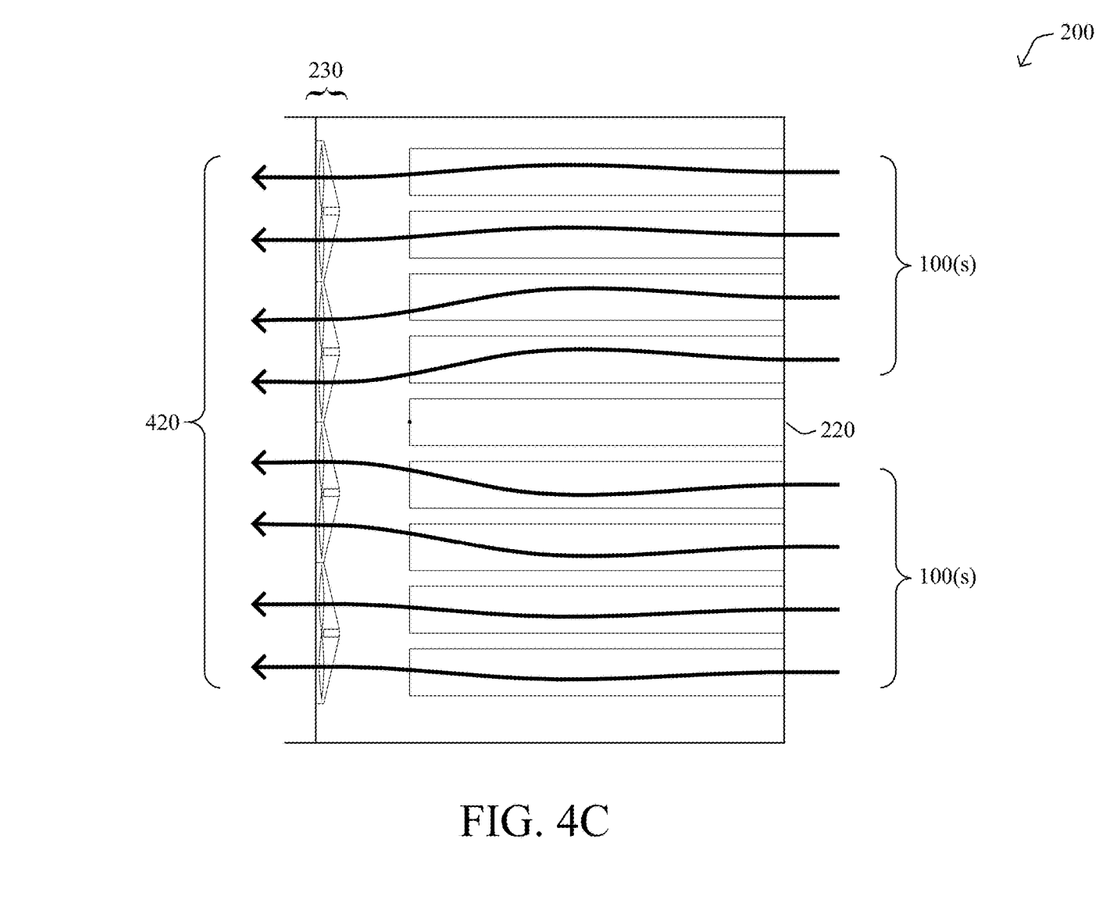

Notably, however, there is a point at which too little restriction (too little impedance) from the blank cards 100 results in too much by-pass of the functional line-card(s) 220. For example, as shown in FIG. 4C, the airflow 420 has reached a point where most (e.g., substantially all) of the air passes through the blank cards 100, and not the functional line-card 220. Accordingly, there is a point at which the benefits of increased total airflow become outweighed by the increased bypass.

Figure 5:
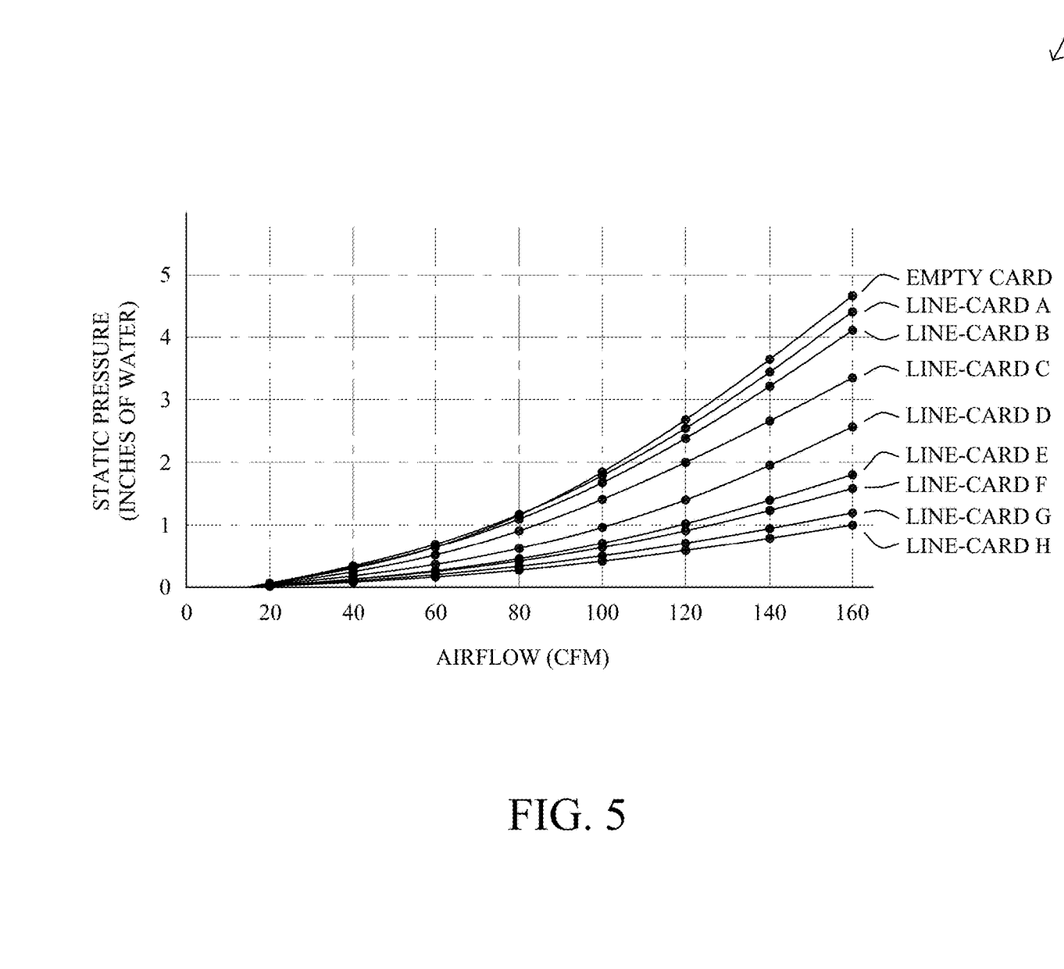
FIG. 5 illustrates an example graph of different line-card impedances.

Note also that for each type of system for which an electronic enclosure 200 may be configured (e.g., enterprise network switches, computing platforms, etc.), there are many different line-card designs that may be used, e.g., to offer different functionality, features, and computing capacity. As can be seen in the illustrative graph 500 of FIG. 5, for example, each line-card A-H (and blank card, e.g., fully open) has its own, unique airflow impedance. Having a single blank card design to address these various impedances on different line-cards is actually an ineffective way to deal with the overall system cooling capacity. The design has to consider the balance of the bypass between line-cards (e.g., spine-cards), as well as the total system airflow rate. (Note further that traditionally, increasing the fan speed is an answer to improve cooling capability, but such an attempt is likely to violate compliance with certain acoustic level thresholds).

The techniques described herein, therefore, allow for more finely tuning the impedance of the blank cards 100, such that based on the number of slots 210, impedance of line-cards 220 (e.g., line-card type), properties of cooling system 230 (e.g., cubic feet per minute or "CFM"), and so on, this "sweet spot" of increased airflow and acceptable bypass can be achieved for each configuration of the electronic enclosure 200, accordingly.

In particular, the techniques herein provide a scalable airflow impedance blank card (e.g., and tray) that allows a single blank design to target various system configurations and different line-card impedances to obtain optimum airflow, and thus provide better cooling within an electronic enclosure. That is, the techniques as described below start with a blank card/tray design 100 where a metal faceplate 110 will have perforation 112 for air intake. However, according to one or more embodiments herein, the faceplate may be configured with a maximum perforation out of the usable faceplate area, and affixed to the faceplate (e.g., behind the faceplate), an adjustable airflow restrictive sheet (e.g., a "flowrate control label") is laminated over the perforations. Thus, based on the system configuration and the line-card impedance rating, one can dynamically change the blank design per desired parameters, resulting in a flow redistribution with higher overall volumetric flow rate, and higher volumetric flowrate for the individual line-cards (e.g., and individual spine cards).

Specifically, according to one or more embodiments of the disclosure as described in detail below, an electromagnetic interference (EMI) shielding faceplate is configured to mount to a line-card slot of a multi-line-card electronic enclosure having an airflow cooling system. A perforation pattern in the faceplate defines an array of perforations in the faceplate, while a flow control sheet (e.g., a laminated sheet) affixed to the faceplate and covering an adjustable percentage of the array of perforations in the faceplate from 0-100%, where an amount of airflow impedance caused by the perforations for the airflow cooling system is based on the percentage of the array of perforations covered by the flow control sheet. Systems and methods employing the faceplate and flow control sheet are also described further below.

Figure 6A:
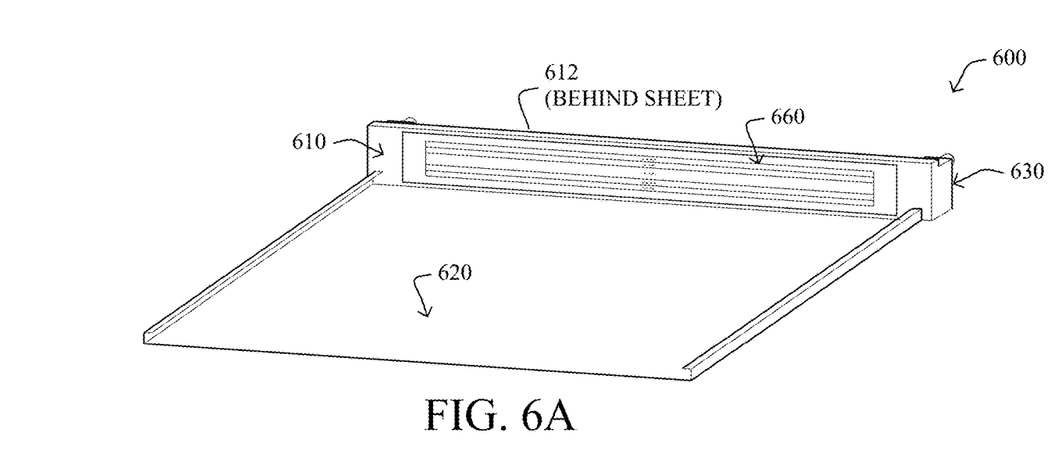
FIGS. 6A-6B illustrate an example of a blank card with scalable airflow impedance for electronic enclosures.
Figure 6B:
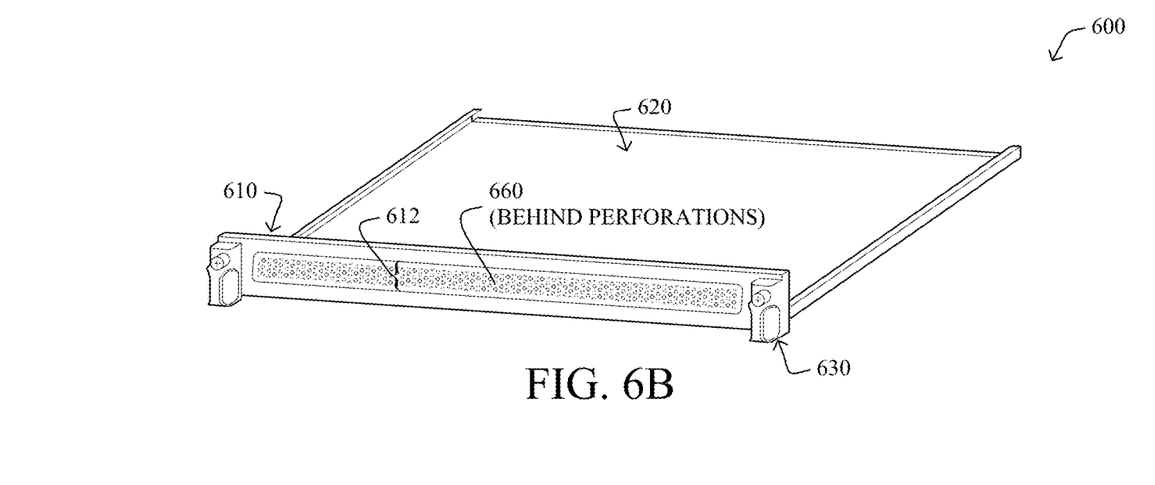

FIGS. 6A-6B illustrate an example of a blank card 600 with scalable airflow impedance for electronic enclosures (back and front views, respectively). In particular, the embodiments herein relate generally to a single blank card design (similar to blank card 100 of FIG. 1) where a flow control sheet 660 is configured to provide various percentages of openness of the perforation 612 on the faceplate 610 in order to address the variety of airflow impedances on the system (enclosure 200). In particular, the faceplate 610 of the blank card 600 may be metallic (e.g., sheet metal), and is configured to mount to the line-card slot 210 of the multi-line-card electronic enclosure 200 (e.g., as a field replaceable unit). The perforation pattern 612 defines the array of perforations, which, in one particular embodiment, are across a maximum airflow-usable area of the faceplate (i.e., as much perforation as possible). In certain embodiments, the blank card 600 may also have a card tray 620 and mounting components 630.

Figure 7A:
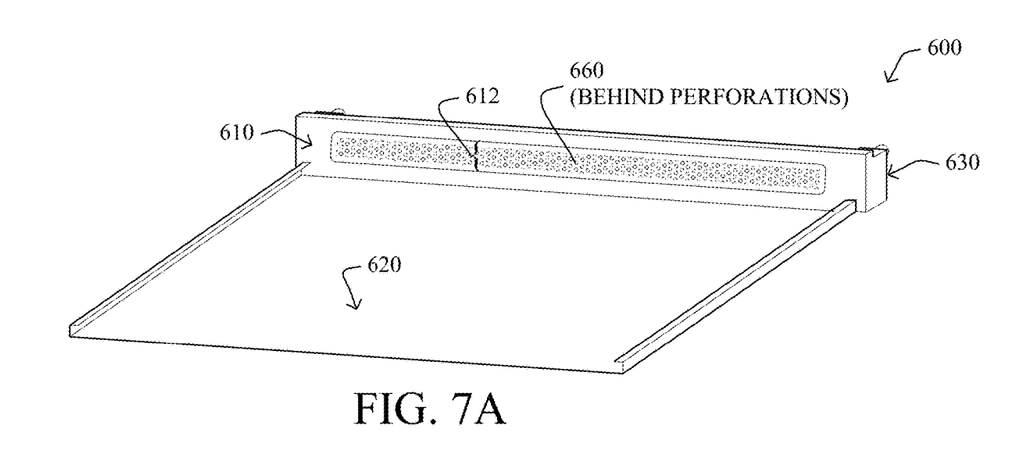
FIGS. 7A-7B illustrate another example of a blank card with scalable airflow impedance for electronic enclosures.
Figure 7B:
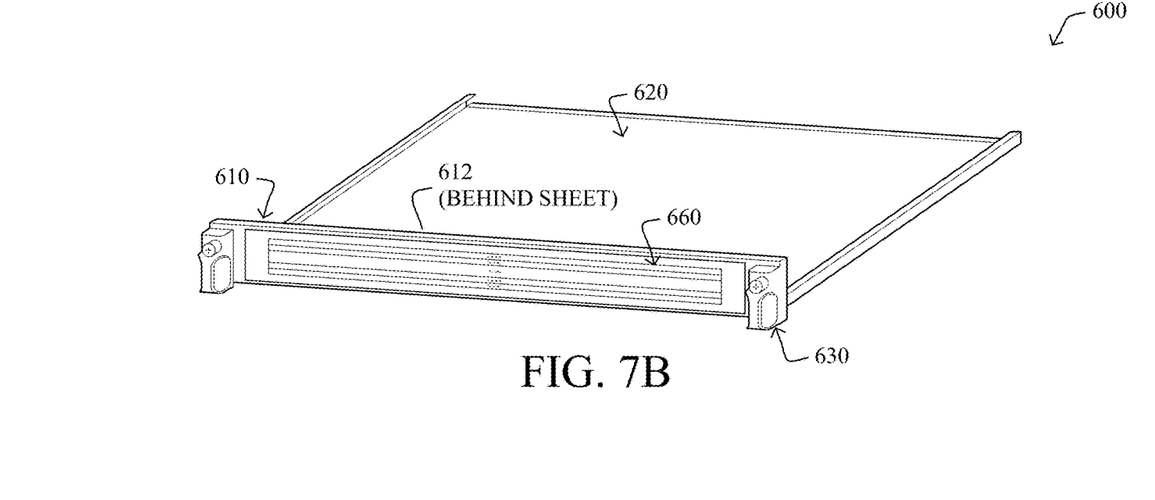

Note that while FIGS. 6A-6B illustrate the flow control sheet 660 on the "inside" of the blank card 600 (e.g., so the flow control sheet may be adjusted as described herein during install of the card, and then generally left alone unless opening the enclosure in the future), alternative embodiments may provide for the flow control sheet 660 to be located on the "outside" of the blank card (e.g., to allow for adjustability without removing the blank card). In other words, the faceplate 610 has a "fan-facing side" (the inside facing the cooling system 230) and a "non-fan-facing side" (the outside facing open air), and as such, the flow control sheet may be affixed to either the fan-facing side or the non-fan-facing side. FIGS. 7A-7B illustrate the alternative (or additional) embodiment where the flow control sheet 660 (or portions thereof) may be located on the outside/front of the faceplate 610.

Figure 8:
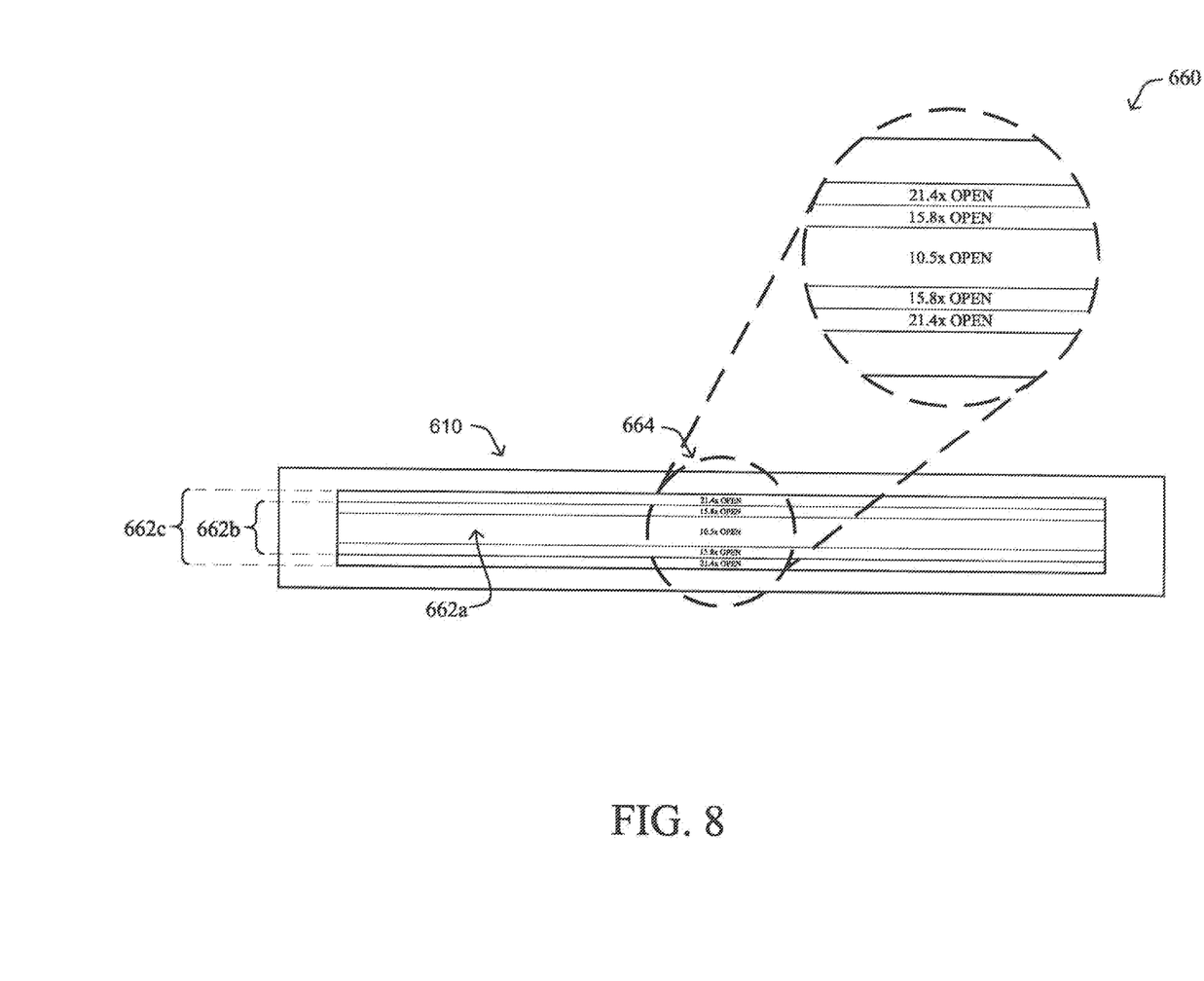
FIG. 8 illustrates an example adjustable flow control sheet for controlling the airflow impedance for electronic enclosures.

With reference also to FIG. 8, the flow control sheet 660 can be affixed to the faceplate to cover an adjustable percentage of the array of perforations 612 in the faceplate 610 (i.e., from 0-100%). In this manner, an amount of airflow impedance caused by the perforations 612 for the airflow cooling system 230 is based on the percentage of the array of perforations covered by the flow control sheet 660.

Illustratively, the flow control sheet 660 may be an adhesive sheet (e.g., a sticker), while in another embodiment it is a magnetic sheet (where the faceplate is metallic), such as a thin flexible magnet material. As shown in FIG. 8, the flow control sheet 660 comprises removable windows 662 to adjust the covered percentage of the array of perforations in the faceplate, where each window determines the amount of airflow that would go through it. That is, flowrate may be controlled by "peeling off" certain portions (e.g., windows 662) from the sheet 660 (during system level configuration in FIGS. 6A-6B, or else any time in FIGS. 7A-7B). Various techniques may be used to create the windows, such as "kiss cutting" lines into the sheet 660 (pressing most of the way through with a cutting tool/die) to allow each layer to be peeled according to the desired impedance of the system configuration and line-card configurations.

Illustratively, three removable windows may be defined as shown in FIG. 8, but the techniques herein are not so limited, and any number, shape, size, orientation, etc. of adjustable portions/windows of the adjustable flow control sheet 660 may be configured accordingly (e.g., width-wise portions, height-wise portions, congruent portions, distributed portions, etc.). Through experimentation, it was found that configuring the removable windows 662 as three removable windows 662a, 662b, and 662c that are configured to expose approximately 50% of the perforations, approximately 75% of the perforations, and approximately 100% of the perforations, respectively, offered a suitable range of impedances to accommodate a large number of line-card types and line-card configurations within the enclosure 200. Illustratively, based on the maximum-hex perforation, these window sizes correlate generally to a level of "openness" of the faceplate with ranges of 7-13%, 13-19% and 19%-25%. Depending on the substantially precise arrangement of the sheet's windows 662 and the underlying perforation pattern 612, more exact openness values may be determined, such as, e.g., 10.5%, 15.8%, 21.4%, respectively, in the illustrative embodiment shown in FIG. 8. Note that for ease of operation, the flow control sheet 660 may have markings or indicia 664 on the removable windows 662 that indicate the percent opening on each portion, or a percent of exposed perforations (that is, based on the adjusted airflow impedance related to each respective removable window).

Figure 9:
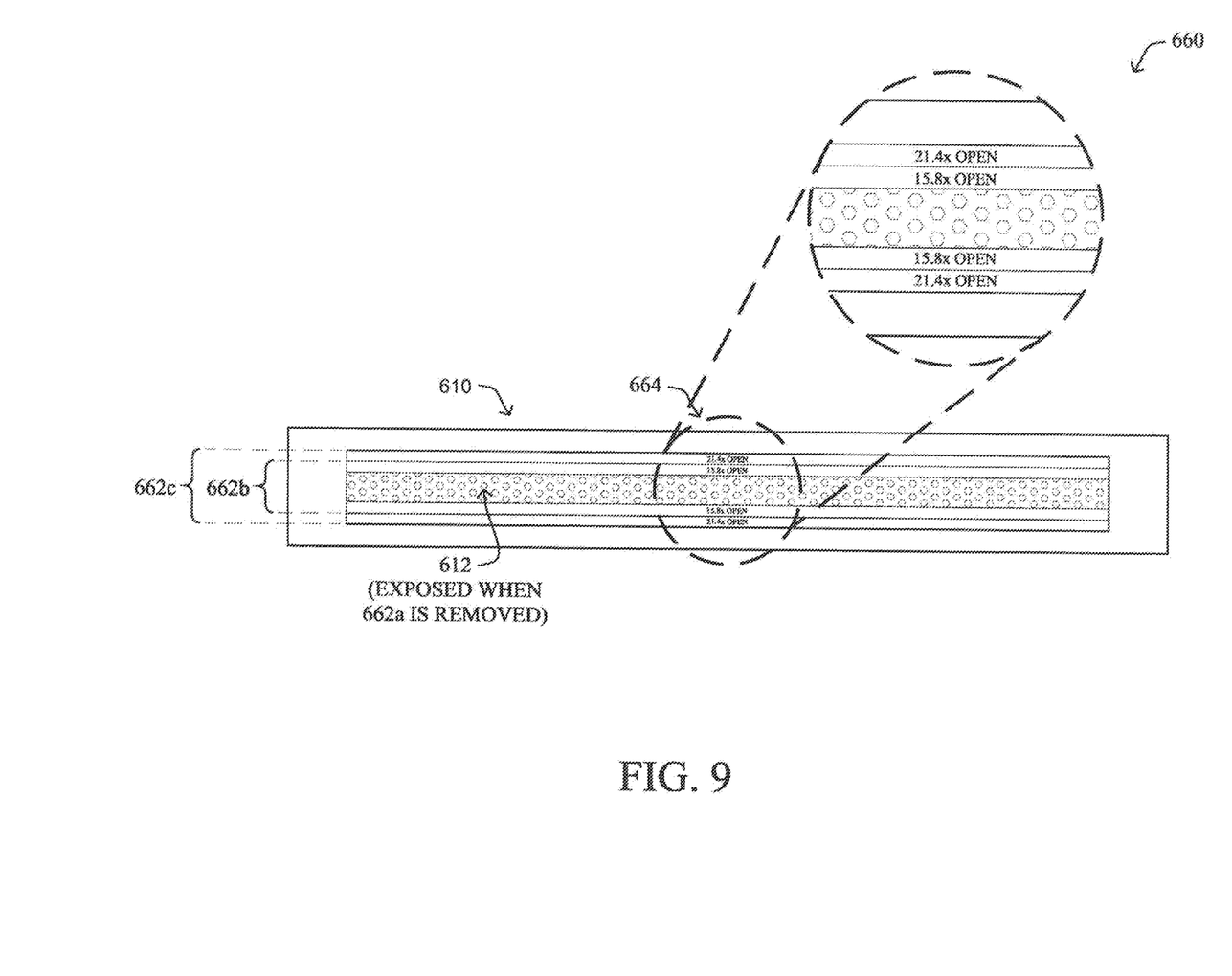
FIG. 9 illustrates an example of an adjusted flow control sheet for controlling the airflow impedance for electronic enclosures.

FIG. 9 illustrates an example of the flow control sheet 660 having been adjusted (e.g., peeling back portion 662a), exposing the perforation pattern 612 (e.g., an illustrative maximum-hex perforation pattern, punched into the sheet metal of the faceplate 610). Note that a contract manufacturer or other device administrator can perform the configuration based on a desired impedance of the enclosure 200 (e.g., based on an order received from customers during manufacturing, or else installed in the field). As mentioned above, flow control sheet 660 may be configured to provide an adjustable percentage by either adding or removing one or more portions 662 of the flow control sheet from the faceplate, to either reduce or increase airflow impedance through the array of perforations, respectively. Said differently, the techniques herein are field reconfigurable, where removing (e.g., peeling) additional parts of a sheet can reduce the restriction, and in the opposite direction, field replacement/addition of some of the blocking sheeting material may be used to increase the airflow impedance (e.g., new or replacement sticker sheets, reusable magnets, etc.).

Figure 10:
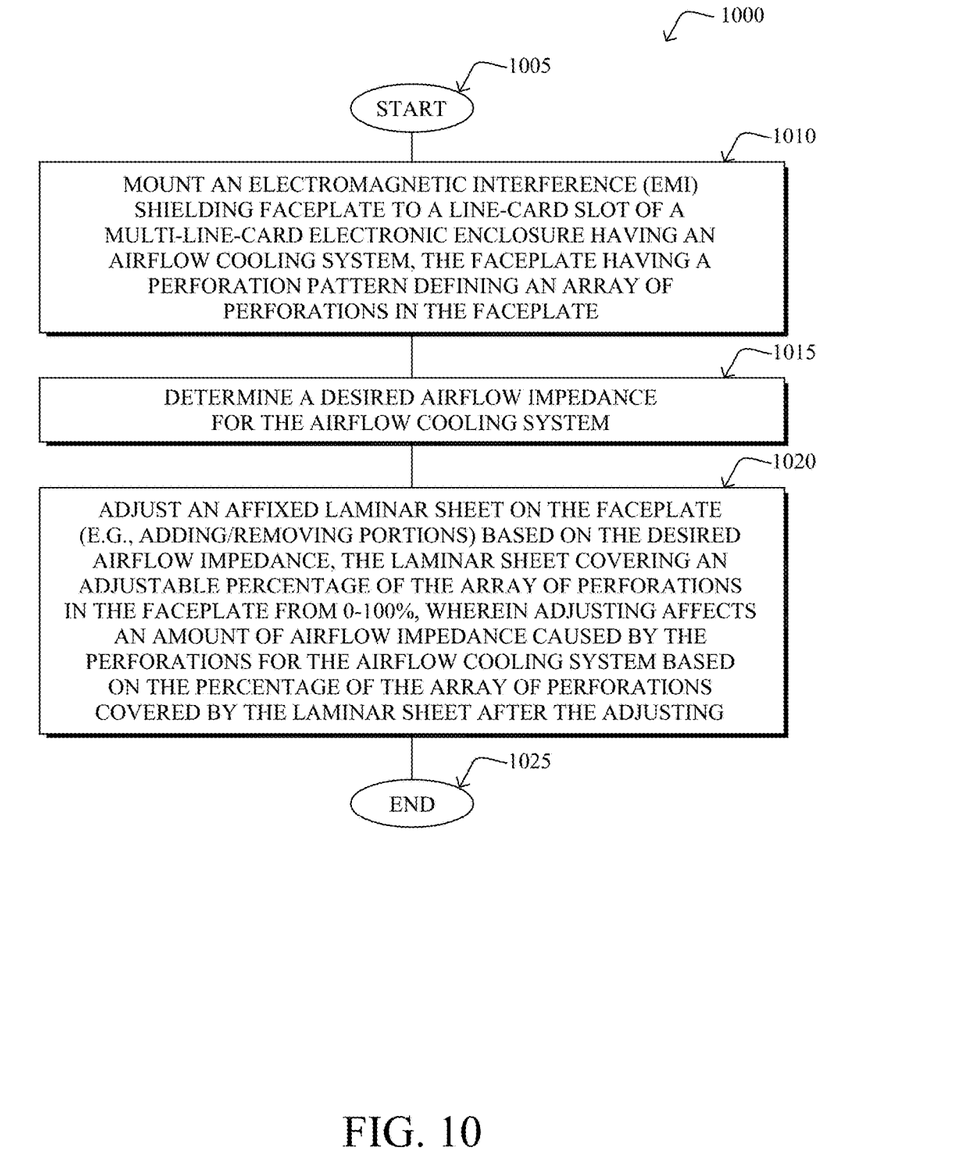
FIG. 10 illustrates an example simplified procedure for use with a blank card with scalable airflow impedance for electronic enclosures.

FIG. 10 illustrates an example simplified procedure for use with a blank card with scalable airflow impedance for electronic enclosures in accordance with one or more embodiments described herein. The procedure 1000 may start at step 1005, and continues to step 1010, where, as described in greater detail above, an electromagnetic interference (EMI) shielding faceplate can be mounted to a line-card slot of a multi-line-card electronic enclosure having an airflow cooling system, the faceplate having a perforation pattern defining an array of perforations in the faceplate. Based on determining a desired airflow impedance for the airflow cooling system in step 1015, an affixed flow control sheet on the faceplate can then be adjusted in step 1020 based on the desired airflow impedance. As described in detail above, the flow control sheet covers an adjustable percentage of the array of perforations in the faceplate from 0-100%, where the adjusting affects an amount of airflow impedance caused by the perforations for the airflow cooling system based on the percentage of the array of perforations covered by the flow control sheet after the adjusting. In one instance, one or more portions of the flow control sheet may be removed from the faceplate to reduce airflow impedance through the array of perforations, while in another instance, one or more portions of the flow control sheet may be added to the faceplate to increase airflow impedance through the array of perforations. Note that the adjustment to the flow control sheet may be performed on either the fan-facing side or the non-fan-facing side of the faceplate. The illustrative simplified procedure 1000 ends in step 1025.

It should be noted that certain steps within procedure 1000 may be optional, and the steps shown in FIG. 10 are merely examples for illustration, and certain other steps may be included or excluded as desired, such as mounting functional line-cards, additional blank cards, or other steps relative to configuring an electronic enclosure. Further, while a particular order of the steps is shown, this ordering is merely illustrative, and any suitable arrangement of the steps may be utilized without departing from the scope of the embodiments herein. Also, the procedure may repeat from any step, such as starting with a new determination for a new airflow impedance (e.g., based on performance or based on added/removed functional line-cards).

The techniques described herein, therefore, provide for a blank card with scalable airflow impedance for electronic enclosures. In particular, the techniques herein provide a solution to scale up or down the airflow impedance based on the system configuration and the behavior of the line card impedance. Blank cards should dynamically respond to the system cooling needs: they should be adjustable or scalable to provide the optimum flow rate in the case of a partially loaded system. The laminated flow controlled sheet/label (e.g., with maximum perforation) addresses the scalability challenge of the traditional blank card concept, and doesn't impact the overall EMI concern.

Notably, the techniques herein do not require strategic placement of the functional line-cards inside the system to manage airflow distribution, or any complex systems or moving parts. Instead, the techniques herein merely require adjusting the level of opening of the perforation to address a variety of airflow impedances on the system, achieving higher balanced volumetric flow rate from a front-end inlet. In addition, the low-cost solution herein improves the overall cooling capacity of the system, and can be adjusted over the course of the system life span (e.g., without having to design or purchase different blanks to target certain airflow impedance functional cards).

Furthermore, the increased volume flow rates due to the mechanisms herein can translate to lower fan speeds, thus i) avoiding possible violation of acoustic compliance to the network equipment building system (NEBS) standards; and ii) decreasing the overall power consumption of the fans. Also, the mechanisms herein do not attempt to adjust fan speed or change fan size/quantity, and there are no feedback systems or complex algorithms required. Moreover, it should be noted again that the techniques herein can be applied to both Front-to-Back and Side-to-Side architectures, and fan placement and/or airflow direction are not critical to the functionality of the system.

While there have been shown and described illustrative embodiments that provide for a blank card with scalable airflow impedance for electronic enclosures, it is to be understood that various other adaptations and modifications may be made within the spirit and scope of the embodiments herein. For example, the embodiments have been shown and described herein with relation to certain line-card or chassis configurations. However, the embodiments in their broader sense are not as limited, and may, in fact, be used with other types of electronic enclosures and orientations, including other styles of airflow cooling systems (e.g., pull-through, push-through, etc.). In addition, while certain configurations of the perforation patterns and flow control sheet coverings/openings are shown, other suitable configurations may be used, accordingly.

The foregoing description has been directed to specific embodiments. It will be apparent, however, that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. An apparatus, comprising:
   an electromagnetic interference (EMI) shielding faceplate configured to mount to a line-card slot of a multi-line-card electronic enclosure having an airflow cooling system;
   a perforation pattern in the faceplate defining an array of perforations in the faceplate; and
   a flow control sheet affixed to the faceplate and covering an adjustable percentage of the array of perforations in the faceplate from 0-100%, wherein an amount of airflow impedance caused by the perforations for the airflow cooling system is based on the percentage of the array of perforations covered by the flow control sheet, wherein the flow control sheet comprises removable windows to adjust a covered percentage of the array of perforations faceplate.

2. The apparatus as in claim 1, wherein the flow control sheet is configured to provide an adjustable percentage by removing one or more portions of the flow control sheet from the faceplate to reduce airflow impedance through the array of perforations.

3. The apparatus as in claim 1, wherein the flow control sheet is configured to provide an adjustable percentage by adding one or more portions of the flow control sheet to the faceplate to increase the airflow impedance through the array If perforations.

4. The apparatus as in claim 1, wherein the flow control sheet is an adhesive sheet.

5. The apparatus as in claim 1, wherein the flow control sheet is a magnetic sheet, and wherein the faceplate is metallic.

6. The apparatus as in claim 1, wherein the removable windows comprise first, second, and third removable windows that are configured to expose 50% of the perforations, 75% of the perforations, and 100% of the perforations, respectively.

7. The apparatus as in claim 1, further comprising:
   indicia on each of the removable windows based on adjusted airflow impedance related to each respective removable window.

8. The apparatus as in claim 1, wherein the faceplate has a fan-facing side and a non-fan-facing side, and wherein the flow control sheet is affixed to one of either the fan-facing side or the non-fan-fixing side.

9. The apparatus as in claim 1, wherein the perforation pattern defines the array of perforations across an airflow-usable area of the faceplate.

10. The apparatus as in claim 1, wherein the perforation pattern is a hex perforation pattern.

11. The apparatus as in claim 1, further comprising:
a blank line-card tray configured to fit through the line-card slot of the multi-line-card electronic enclosure.

12. The apparatus as in claim 1, wherein the faceplate comprises sheet metal.

13. The apparatus as in claim 1, wherein the faceplate is configured to mount to the line-card slot of the multi-line-card electronic enclosure as a field replaceable unit.

14. A method, comprising:
mounting an electromagnetic interference (EMI) shielding faceplate to a line-card slot a multi-line-card electronic enclosure having an airflow cooling system, the faceplate having a perforation pattern defining an array of perforations in the faceplate;
determining a desired airflow impedance for the airflow cooling system; and
adjusting an affixed flow control sheet on the faceplate based on the desired airflow impedance, the flow control sheet covering an adjustable percentage of the array of perforations in the faceplate from 0-100%, wherein adjusting affects an amount of airflow impedance caused by the perforations for the airflow cooling system based on the percentage of the array of perforations covered by the flow control sheet after adjusting, wherein the flow control sheet includes removable windows to adjust a covered percentage of the array of perforations in the faceplate.

15. The method as in claim 14, wherein adjusting the flow control sheet to cover the adjustable percentage comprises:
removing the removable window of the flow control sheet from the faceplate to reduce the airflow impedance through the array of perforations.

16. The method as in claim 14, herein adjusting the flow control sheet to cover the adjustable percentage comprises:
adding one or more portions of the flow control sheet to the faceplate to increase the airflow impedance through the array of perforations.

17. The method as in claim 14, wherein the flow control sheet is one of either an adhesive sheet or a magnetic sheet.

18. The method as in claim 14, wherein the faceplate has a fan-facing side and a non-fan-facing side, the method further comprising:
adjusting the flow control sheet on one of either the fan-facing side or the non-fan-facing side.

19. A system, comprising:
a multi-line-card electronic enclosure;
an airflow cooling system for the multi-line-card electronic enclosure;
one or more functional line-cards located in a corresponding line-card slot of the multi-line-card electronic enclosure; and
one or more electromagnetic interference (EMI) shielding faceplates mounted to a corresponding line-card slot of the multi-line-card electronic enclosure, the one or more faceplates each having a perforation pattern defining an array of perforations in the corresponding faceplate, and an affixed flow control sheet covering an adjustable percentage of the array of perforations in the corresponding faceplate from 0-100%, wherein an amount of airflow impedance caused by the perforations for the airflow cooling system is based on the percentage of the array of perforations covered by the flow control sheet for the one or more faceplates, wherein the flow control sheet includes removable windows to adjust a covered of the array perforations in the corresponding faceplate.

* * * * *

UNITED STATES PATENT AND TRADEMARK OFFICE
CERTIFICATE OF CORRECTION

PATENT NO. : 9,949,408 B2  
APPLICATION NO. : 15/166551  
DATED : April 17, 2018  
INVENTOR(S) : Vic Chia et al.

Page 1 of 1

It is certified that error appears in the above-identified patent and that said Letters Patent is hereby corrected as shown below:

In the Claims

In Column 8, Line 43, please amend as shown:
perforations in the faceplate.

In Column 8, Line 53, please amend as shown:
Array of perforations.

In Column 9, Line 4, please amend as shown:
side or the non-fan-facing side.

In Column 10, Line 36, please amend as shown:
windows to adjust a covered percentage of the array of perforations in Signed and Sealed this
Twenty-seventh Day of October, 2020

Andrei Iancu
*Director of the United States Patent and Trademark Office*